(12) United States Patent
Pache et al.

(10) Patent No.: US 10,312,889 B2
(45) Date of Patent: Jun. 4, 2019

(54) CLOCK SIGNAL GENERATOR

(71) Applicant: STMicroelectronics SA, Montrouge (FR)

(72) Inventors: Denis Pache, Grenoble (FR); Stephane Le Tual, Saint-Egreve (FR); Hanae Zegmout, Saint-Vincent-de-Mercuze (FR)

(73) Assignee: STMicroelectronics SA, Montrouge (FR)

( * ) Notice: Subject to any disclaimer, the term of this patent is extended or adjusted under 35 U.S.C. 154(b) by 159 days.

(21) Appl. No.: 15/605,541

(22) Filed: May 25, 2017

(65) Prior Publication Data

US 2018/0152180 A1    May 31, 2018

(30) Foreign Application Priority Data

Nov. 30, 2016    (FR) ...................................... 16 61724

(51) Int. Cl.
| | | |
|---|---|---|
| *H03K 3/42* | (2006.01) | |
| *G06F 1/10* | (2006.01) | |
| *H03M 1/12* | (2006.01) | |
| *H01L 31/08* | (2006.01) | |
| *H03K 3/36* | (2006.01) | |

(52) U.S. Cl.
CPC ............... *H03K 3/42* (2013.01); *G06F 1/105* (2013.01); *H01L 31/08* (2013.01); *H03K 3/36* (2013.01); *H03M 1/1255* (2013.01)

(58) Field of Classification Search
CPC ....................................................... H03K 3/42
See application file for complete search history.

(56) References Cited

U.S. PATENT DOCUMENTS

| | | | |
|---|---|---|---|
| 3,521,244 A | 7/1970 | Weimer | |
| 4,766,471 A | 8/1988 | Ovshinsky et al. | |
| 5,418,360 A | 5/1995 | Sokolowska et al. | |
| 7,940,201 B1 | 5/2011 | Cosand | |
| 2006/0251427 A1 | 11/2006 | Furuyama | |
| 2018/0152179 A1* | 5/2018 | Zegmout | H03K 3/42 |

FOREIGN PATENT DOCUMENTS

| | | |
|---|---|---|
| EP | 0 398 038 A2 | 11/1990 |
| EP | 0 525 819 A1 | 2/1993 |
| JP | 58-18988 A | 2/1983 |

OTHER PUBLICATIONS

"Enhanced Responsivity up to 2.85 A/W of Si-based $Ge_{0.9}Sn_{0.1}$ Photoconductors by Integration of Interdigitated Electrodes," 2015 Conference on Lasers and Electro-Optics (CLEO), May 10-15, 2015, San Jose, CA, 2 pages.

(Continued)

*Primary Examiner* — Fritz M Fleming
(74) *Attorney, Agent, or Firm* — Seed IP Law Group LLP (57) ABSTRACT

The present disclosure relates to a device for generating a clock signal including a first photoresistor coupling a capacitive output node to a node receiving a first potential. A second photoresistor couples the capacitive node to a node receiving a second potential. The first and second photoresistors receive the same optical pulses of a mode-locked laser at instants in time offset by a first delay.

16 Claims, 6 Drawing Sheets

(56) References Cited

OTHER PUBLICATIONS

Broekaert et al., "InP-HBT Optoelectronic Integrated Circuits for Photonic Analog-to-Digital Conversion," *IEEE Journal of Solid-State Electronics* 36(9):1335-1342, 2001.
Debaes et al., "Receiver-Less Optical Clock Injection for Clock Distribution Networks," *IEEE Journal of Selected Topics in Quantum Electronics* 9(2):400-409, 2003.
French Search Report, dated Aug. 23, 2017, for French Application No. 1661724, 12 pages.
French Search Report, dated Jul. 20, 2017, for French Application No. 1661725, 10 pages.
U.S. Appl. No. 15/605,536, filed May 25, 2017, Clock Signal Generator.

\* cited by examiner

CLOCK SIGNAL GENERATOR

BACKGROUND

Technical Field

The present application relates to an optoelectronic device and, in particular, to a device for generating a clock signal.

Description of the Related Art

Figure 1:
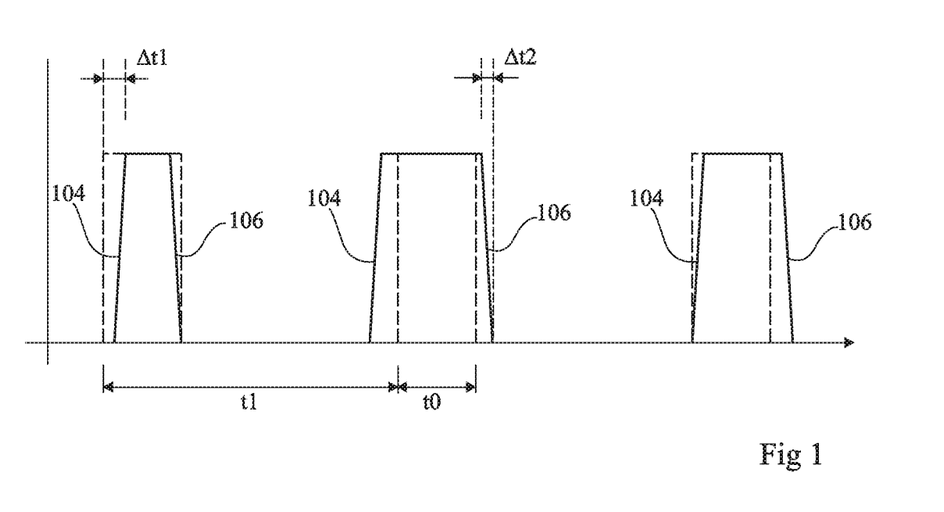
FIG. 1, described above, illustrates clock signals as a function of time.

In FIG. 1, the dashed lines represent an ideal clock signal and the solid lines represent the corresponding clock signal obtained in practice, as a function of time. The clock signal is intended to be used by an electronic circuit, for example a high-resolution (e.g., higher than 14 bits) analog-to-digital conversion (ADC) circuit and a high-frequency (e.g., higher than 1 GHz) signal to be converted. The clock frequency of the clock signal may be high, for example higher than 100 MHz.

It would be desirable, for the ADC circuit, for the clock signal to correspond to the ideal signal. The ideal signal has pulses in the form of slots of identical duration t0, and successive rising edges 104 separated by a regular duration t1. Additionally, the ideal signal passes instantaneously from a low value to a high value at the start of each pulse, then, at the end of each pulse, the ideal signal instantaneously returns to the low value.

However, in practice, it is difficult to obtain rise and fall times of less than a few picoseconds (ps). Additionally, in the clock signal obtained in practice, the rising edges are not perfectly regular. With respect to the ideal rising edges 104, the rising edges are premature or delayed by a random duration Δt1. The duration Δt corresponds to an instability value, the standard deviation (or RMS value, for Root Mean Square) of which is referred to as jitter. Moreover, the durations of the pulses obtained in practice are not perfectly identical for all of the pulses, and the falling edges 106 exhibit a jitter Δt2. The clock signals generated by current clock devices have rising and falling edges that exhibit non-negligible jitter, for example of several tens of femtoseconds (fs).

BRIEF SUMMARY

One embodiment makes provision for a device overcoming all or some of the drawbacks described above.

One embodiment makes provision for a device for generating a clock signal having very low rising and falling edge jitter, for example of less than 10 fs.

One embodiment makes provision for a device for generating a clock signal having very short rise and fall times, for example of less than 3 ps.

Thus, one embodiment makes provision for a device for generating a clock signal. The device includes a first photoresistor coupling a capacitive output node to a node for applying a first potential and a second photoresistor coupling the capacitive node to a node for applying a second potential. The first and second photoresistors are capable of receiving the same optical pulses of a mode-locked laser at instants in time offset by a first delay.

According to one embodiment, the device comprises a first optical splitter capable of transmitting the optical pulses to first and second waveguides having different lengths.

According to one embodiment, the first delay is between 20 and 100 ps.

According to one embodiment, the product of the capacitance of the capacitive node and the resistance value of each photoresistor in the on state is less than 3 ps.

According to one embodiment, provision is made for each photoresistor to have, during the optical pulses, a resistance value of less than 50Ω.

According to one embodiment, the center wavelength of the optical pulses is between 1.3 and 1.8 μm, and each photoresistor comprises a germanium region doped to less than $5*10^{16}$ atoms/cm$^3$ and equipped with two contacts which are separated by a distance of between 0.3 and 3 μm.

According to one embodiment, each germanium region is on an extension of a silicon core of one of the waveguides.

According to one embodiment, the product of the capacitance of the capacitive node and the resistance value of each photoresistor in the off state is more than 2 ns.

Another embodiment makes provision for a device for generating a clock signal including first and second devices as described above, capable of receiving the same optical pulses of a mode-locked laser at instants in time offset by a second delay, and an RS flip-flop circuit having two inputs which are coupled to the capacitive nodes of the first and second devices.

According to one embodiment, the device includes a second optical splitter capable of transmitting the optical pulses to third and fourth waveguides having different lengths.

According to one embodiment, the second delay is between 100 and 1000 ps.

According to one embodiment, the flip-flop circuit is a differential-type logic circuit.

BRIEF DESCRIPTION OF THE SEVERAL VIEWS OF THE DRAWINGS

These features and advantages, along with others, will be presented in detail in the following description of particular embodiments, provided without limitation and in relation to the appended figures among which.

DETAILED DESCRIPTION

Identical elements are denoted by the same references in the various figures and, furthermore, the various timing diagrams and views are not drawn to scale. For the sake of clarity, only those elements which are of use in understanding the described embodiments are shown and described in detail. In particular, the laser sources emitting optical pulses and the circuits using electronic pulses are not shown in detail.

Throughout the following description, unless specified otherwise, the expressions "substantially", and "of the order of" signify to within 10%, preferably to within 5%.

Throughout the present description, the term "connected" denotes a direct electrical connection between two elements, while the term "coupled" denotes an electrical connection between two elements that may be direct or take place via one or more passive or active components, such as resistors, capacitors, inductors, diodes, transistors, etc.

A device is proposed here that allows a square wave electronic pulse to be generated on the basis of each of the optical pulses delivered by a laser source of mode-locked type. Such a pulsed laser signal exhibits very short optical pulses, for example of less than 100 fs in duration, and very low rising and falling edge jitter, typically of less than 10 fs.

Figure 2A:
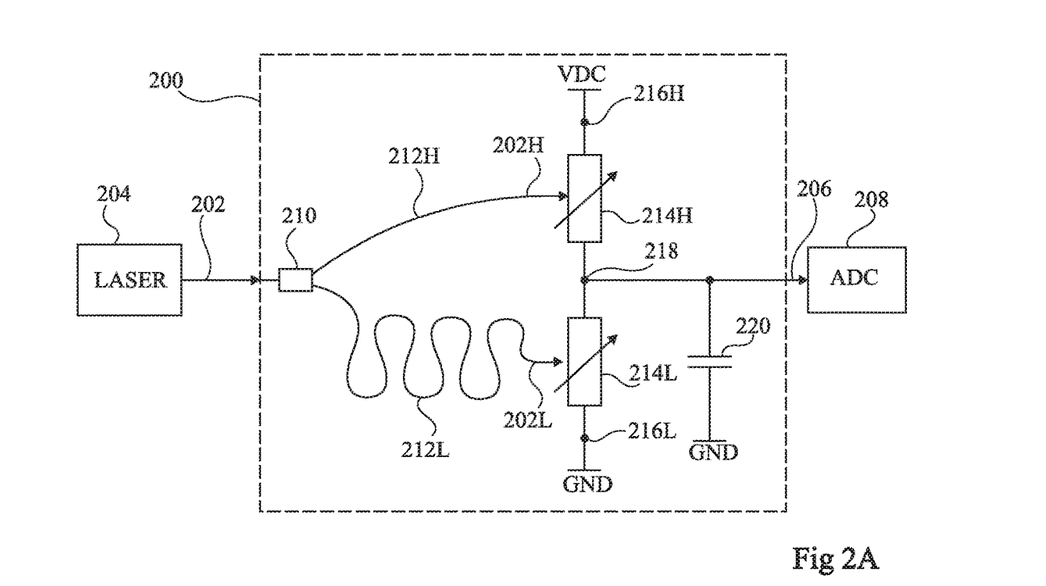
FIG. 2A is a schematic representation of one embodiment of a clock device according to the present disclosure.

FIG. 2A is a schematic representation of one embodiment of a clock device 200 according to the present disclosure. The clock device 200 receives a pulsed laser signal 202 delivered by a pulsed laser source 204 (LASER) of mode-locked type. The device 200 generates a clock signal 206, intended for example for a high-resolution ADC circuit 208 with a high-frequency signal to be converted.

The device 200 comprises an optical splitter 210 which receives the laser signal 202. The optical splitter transmits, for example, substantially equal portions 202H and 202L of the laser signal to two respective waveguides 212H and 212L.

A photoresistor 214H is optically coupled to the waveguide 212H, and a photoresistor 214L is optically coupled to the waveguide 212L. The length of the waveguide 212L between the optical splitter 210 and the photoresistor 214L is greater than the length of the waveguide 212H between the optical splitter 210 and the photoresistor 214H. In order to achieve this, the waveguide 212L takes, for example, a meandering form.

The photoresistors 214H and 214L each comprise a semiconductor region that is either intrinsic or lightly doped, for example to less than $5*10^{16}$ atoms/cm$^3$ or to a level of the order of $5*10^{16}$ atoms/cm$^3$, preferably with germanium in the case of a laser the center wavelength of which is located in the near infrared and is for example between 1.3 and 1.8 μm. Each semiconductor region is equipped, on either side, with two contacts separated by a distance of between 3 et 9 μm for example.

The photoresistors 214H and 214L are connected in series between, on the photoresistor 214H side, a node 216H for applying a high potential VDC and, on the photoresistor 214L side, a node 216L for applying a low potential, for example a reference potential such as a ground GND.

The node connecting the photoresistors 214H and 214L is a capacitive node 218 of capacitance C. A capacitive node here refers to a node coupled to a node for applying a fixed potential, for example the ground GND, via a capacitive element 220 the capacitance value C of which represents that of all of the elements connected to the capacitive node. By way of example, the capacitive element 220 may be an input capacitor of the ADC circuit 208. The potential of the capacitive node 218 corresponds to the level of the clock signal 206.

The operation of the device of FIG. 2A is described below in relation to FIG. 2B.

Figure 2B:
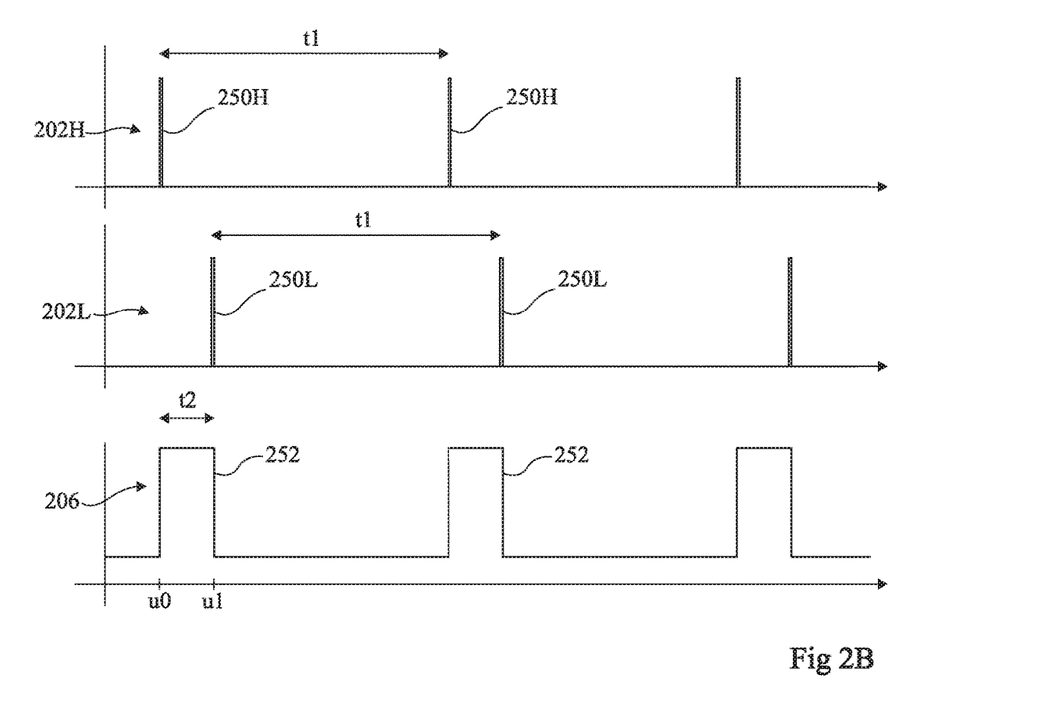
FIG. 2B is a timing diagram illustrating laser signals and a clock signal of the device of FIG. 2A.

FIG. 2B is a timing diagram illustrating the laser signals 202H and 202L and the clock signal 206 of the device of FIG. 2A.

The levels of the laser signals 202H and 202L correspond to the power of the optical radiation received by the photoresistors 214H and 214L, respectively. Each of the signals 202H and 202L exhibits respective pulses 250H and 250L between which no meaningful optical radiation is received by the photoresistor in question. By way of example, for each laser signal 202H and 202L, the mean power of the optical pulses is higher than 10 mW.

The optical pulses of each of the laser signals 202H and 202L are at the frequency 1/t1 of the laser signal 202, and have retained the very low jitter of the initial laser signal 202. By way of example, the laser source 204 is designed so that the duration t1 between optical pulses of one and the same laser signal is less than 10 ns. The durations (not visible in FIG. 2B) of the pulses 250H and 250L of the laser signals 202H and 202L correspond to those of the pulses of the laser signal 202, slightly increased due to the presence of the splitter 210 and the waveguides 212H and 212L. The splitter and the waveguides are designed so that the durations of the pulses 250H and 250L remain very short, for example less than 4 ps.

Due to the difference in length of the waveguides 212H and 212L between the optical splitter 210 and the respective photoresistors 214H and 214L, the pulses 250L are delayed by a duration t2 with respect to the pulses 250H. This difference in length is chosen so that the delay t2 corresponds to the pulse duration that it is desired to obtain in the electronic clock signal 206, for example a pulse duration of between 20 and 100 ps.

Each of the photoresistors 214H and 214L has a high resistance value ROFF between the respective optical pulses 250H and 250L. The resistance value of each of the photoresistors 214H and 214L passes to a low value RON when the photoresistor receives an optical pulse. By way of example, the values RON and ROFF are the same for the photoresistors 214H and 214L. Each of the photoresistors 214H and 214L is chosen so that the product of its resistance value $R_{ON}$ and the capacitance value C corresponds to a short duration, for example less than 3 ps. Additionally, the resistance value $R_{ON}$ of each of the photoresistors is chosen so as to be low, for example less than 50Ω, preferably less than 15Ω. Furthermore, the difference between the high VDC and low GND potentials is for example between 0.5 and 2 V.

Upon each optical pulse of the laser signal 202, the optical pulse 250H arising from the waveguide 212H reaches the photoresistor 214H at an instant in time u0. During the pulse 250H, the clock signal 206 passes to a high level. Because the product $R_{ON}$*C for the photoresistor 214H is small, the rise time is very short, for example less than 3 ps.

After this optical pulse 250H, but before the arrival of the optical pulse 250L at the photoresistor 314H, the two photoresistors are in the off state and the high level of the clock signal 206 is maintained by the capacitance C of the node 218.

The optical pulse 250L reaches the photoresistor 214L at an instant in time u1. The clock signal passes to a low level. Because the product $R_{ON}$*C for the photoresistor 214L is small, the fall time is very short, for example less than 3 ps.

After this optical pulse 250L, but before the arrival of a following optical pulse 250H, the two photoresistors are in the off state and the low level of the clock signal is maintained by the capacitance C of the node 218.

Thus, for each optical pulse of the laser signal 202, an electronic clock pulse 252 in the form of slots with very short rise and fall times has been obtained.

Additionally, because the resistance $R_{ON}$ of the photoresistor 214H is low, and because the product $R_{ON}$*C for this photoresistor is small, the jitter of the rising edges that are obtained is particularly low, for example less than 10 fs.

Specifically, a low resistance value $R_{ON}$ allows a particularly low voltage noise level on the node 218 during the rising edges.

Similarly, because the resistance $R_{ON}$ of the photoresistor 214L is low, and because the product $R_{ON}*C$ for this photoresistor 214H is small, the jitter of the falling edges that are obtained is particularly low. Specifically, the delay t2 of the pulses 250L, the arrival of which instigates the falling edges of the clock signal, is produced without generating any meaningful additional jitter with respect to the initial jitter of the laser signal 202.

Moreover, the duration of the obtained pulses corresponds, in an especially exact manner, to the desired value t2. Specifically, the duration of the obtained clock pulses depends only on the difference in length between the waveguides, and this difference in length is easy to produce with precision. In particular, the duration of the obtained pulses does not depend on parameters such as the time taken by each photoresistor to switch to the off state after an optical pulse. It is sufficient for the photoresistor 214H to have time to return to the off state between each received pulse 250H and the following pulse 250L, and for the photoresistor 214L to have time to return to the off state between each received pulse 250L and the following pulse 250H. In order to achieve this, as mentioned above, the contacts on either side of the semiconductor region in each photoresistor are separated by a short distance, for example of less than 3 μm. This distance is chosen so that the charge, generated in the semiconductor region of the photoresistor upon each pulse, which then allows a current to flow, disappears after a time of less than 1 ns, for example.

Furthermore, in order to maintain the high or low level of the clock signal when the photoresistors are in the off state, the duration $R_{OFF}*C/2$ is sufficient, for example more than three times the time t1 separating two pulses of the laser signal 202, for example more than 1 ns. Specifically, this duration is representative of the time that the capacitive node 218 would take to discharge through the photoresistors in the off state in order to reach an equilibrium potential.

Figure 3A:
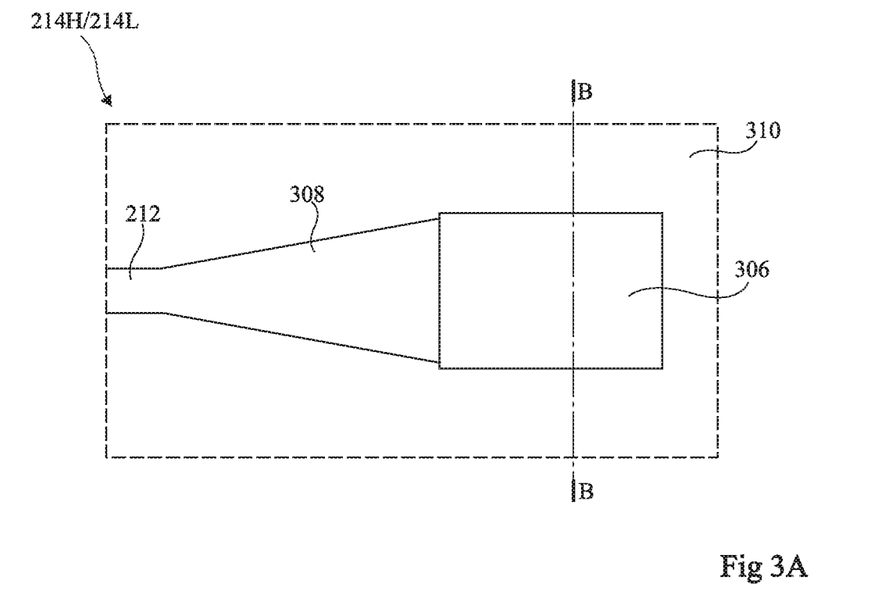
FIGS. 3A and 3B are schematic views from above and in cross section, respectively, of an exemplary embodiment of the photoresistor in the clock device of FIG. 2A.
Figure 3B:
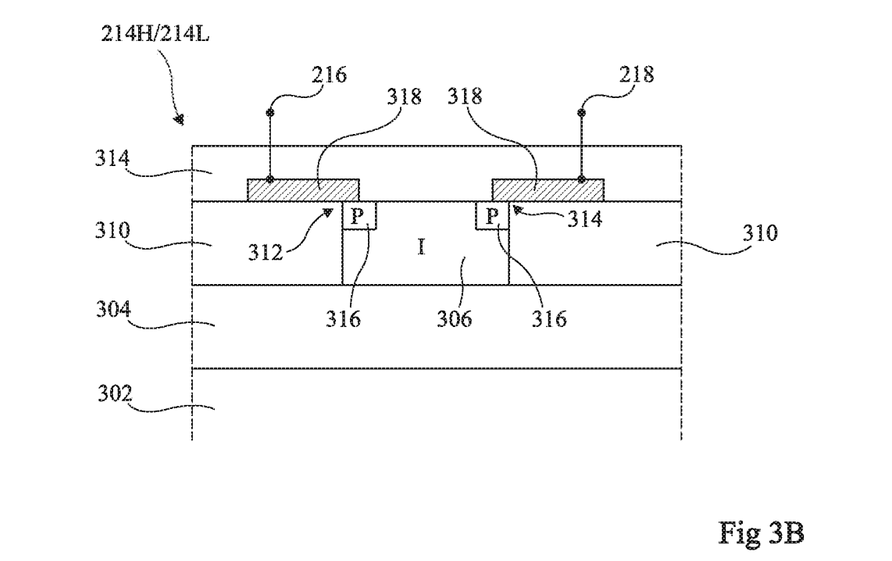

FIGS. 3A and 3B are schematic views from above and in cross section (plane B-B of FIG. 3A), respectively, of an exemplary photoresistor of the type of the photoresistors 214H and 214L of the device 200 of FIG. 2. When reference is made here to the terms "on" or "horizontal", it refers to the orientation of the element in question in FIG. 3B, it being understood that, in practice, the described structure may be oriented differently.

The photoresistor comprises, on a carrier 302 covered with a layer 304 of silicon oxide, a region 306 made of germanium located on the extension of a flared portion 308 of the end of a waveguide core 212. The core 212, the flared portion 308 and the region 306 rest on the layer 304 and are for example substantially equal in thickness. When seen from above, the region 306 takes the form, for example, of a rectangle, one short side of which is in contact with the flared portion 308. A layer 310 of silicon oxide covers the layer 304 outside the core 212, outside the flared portion 308 and outside the region 306, which are flush with the surface of the layer 310. The structure is covered with a layer 314 of silicon oxide. The waveguide core 212, its flared portion 308 and the region 306 are thus surrounded by silicon oxide.

The region 306 is equipped with contacts 312 and 314 on the upper portion, on either side of the region 306, in contact with the layer 310. Exemplary contacts 312 and 314 are shown in detail in the cross-sectional view of FIG. 3B. Each contact comprises a doped region 316, for example a p-doped region, in contact with a metallization 318, which may extend over the layer 310 while being kept away from the region 306. The doped regions 316 of the contacts 312 and 314 are of the same conductivity type. Each doped region 316 and the associated metallization 318 may extend, as seen from above, over the entirety of one side of the region 306. The contacts 312 and 314 are connected to the terminals 216 and 218 of the photoresistor.

The germanium region 306 is intrinsic, i.e., not intentionally doped, or exhibits a low level of doping, for example of less than $5*10^{16}$ atoms/cm$^3$, or to a level of the order of $5*10^{16}$ atoms/cm$^3$, of the same conductivity type as the regions 316, 318.

By way of example, the transverse dimensions of the core 212 are between 300 nm and 3 μm, for example the core 212 has a rectangular cross section of 300 nm in the direction of the thickness of the layers and 500 nm horizontally. By way of example, the width of the rectangle delineated by the region 306, as seen from above, is between 3 and 9 μm. By way of example, the length over which the photoresistor extends from the flared portion 308, or length of the photoresistor, is between 15 and 20 μm.

In operation, by virtue of the region 306 being made of germanium, the optical radiation is efficiently absorbed thereby. A particularly high rate of conversion of the optical radiation to current is obtained, resulting in a low resistance $R_{ON}$ in the on state.

The device 200 described in relation to FIGS. 2A, 2B, 3A and 3B is particularly suitable for generating, for each optical pulse received, an electronic pulse with slots of short duration, typically less than 100 ps. However it may be desired to have clock generators allowing pulses of longer than 100 ps in duration to be obtained, for certain ADC circuits for example. In the case of the device 200, obtaining such durations may prove to be difficult, since a capacitance value C must be chosen that is both sufficiently high to maintain the high level of the clock signal for the duration of one pulse of this signal, and sufficiently low to obtain the low $R_{ON}*C$ values that allow a low jitter value to be achieved.

A device is therefore proposed here that allows an electronic signal with slots of long duration, for example of more than 100 ps, to be generated on the basis of the optical pulses of a pulsed laser.

Figure 4A:
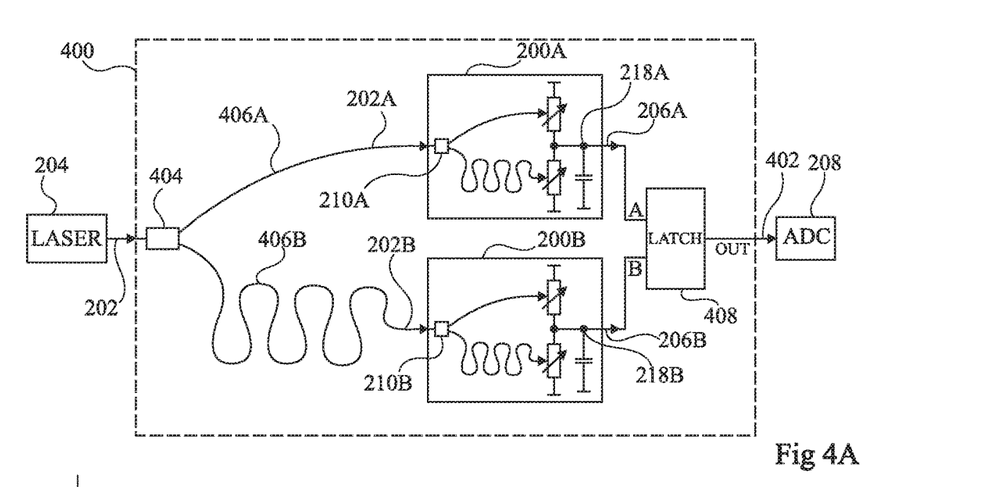
FIG. 4A is a schematic representation of another embodiment of a clock device according to the present disclosure.

FIG. 4A is a schematic representation of an exemplary embodiment of a clock device 400. The clock device 400 receives a pulsed laser signal 202 generated by a pulsed laser source 204 (LASER) of mode-locked type. The device 400 delivers a clock signal 402, intended for example for a high-resolution ADC circuit 208 with a high-frequency signal to be converted.

The device 400 comprises an optical splitter 404 which receives the laser signal 202. The optical splitter 404 is designed to transmit, for example substantially equal, portions 202A and 202B of the laser signal to two respective waveguides 406A and 406B.

The device 400 additionally comprises two devices 200A and 200B, of the type of the device 200 of FIG. 2, for example two identical devices. The optical splitter 210A of the device 200A is connected to the waveguide 406A and the optical splitter 210B of the device 200B is connected to the waveguide 406B. The length of the waveguide 406B between the optical splitter 404 and the optical splitter 210B is greater than the length of the waveguide 406A between the optical splitter 404 and the optical splitter 210A.

Moreover, the device 400 comprises a circuit 408 of asynchronous flip-flop type or RS (LATCH) flip-flop type having a set input (A) coupled to the capacitive node 218A of the circuit 200A and a reset input (B) coupled to the capacitive node 218B of the circuit 200B. The flip-flop circuit 408 delivers the clock signal 402 as output (OUT).

The flip-flop circuit 408 is a high-speed flip-flop circuit, i.e., its switching times are very fast, for example less than 5 ps. In order to achieve this, the flip-flop circuit 408 may be of differential logic type, for example of CML (current mode logic) type.

The operation of the circuit 400 is described below in relation to FIG. 4B.

Figure 4B:
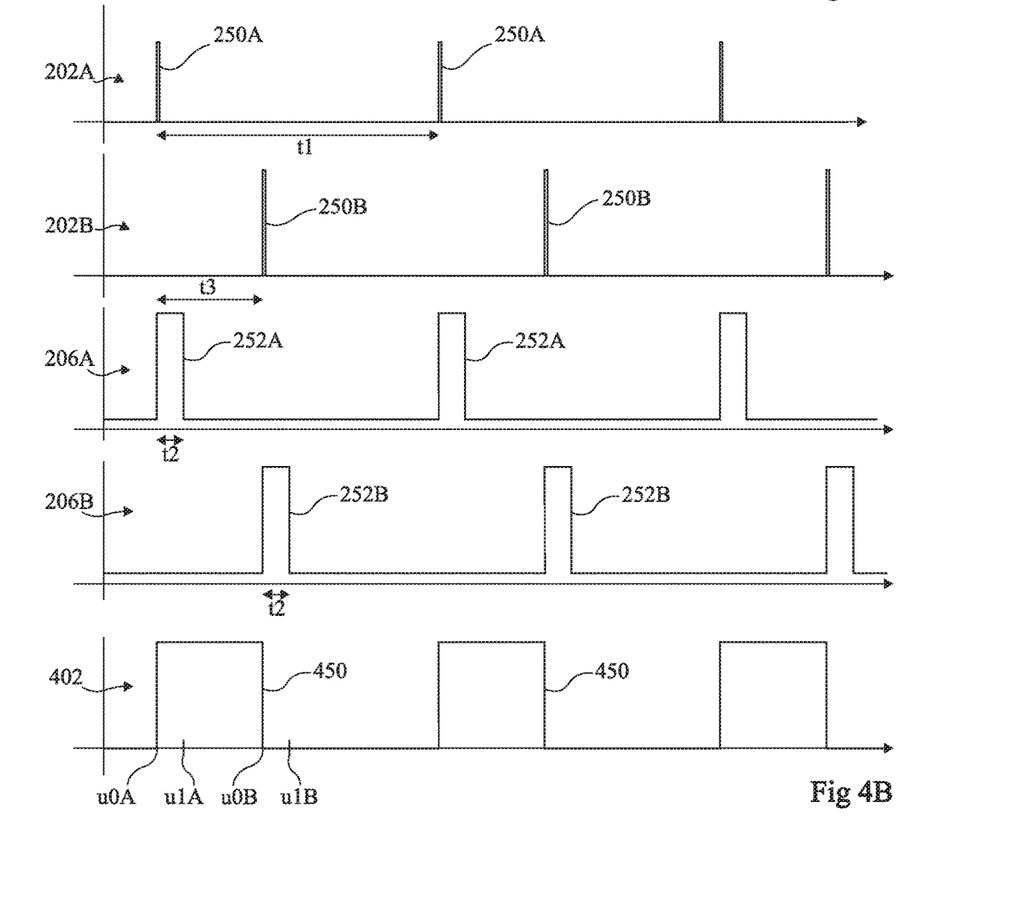
FIG. 4B is a timing diagram illustrating various optical and electronic signals, and a clock signal of the clock device of FIG. 4A.

FIG. 4B is a timing diagram illustrating the laser signals 202A and 202B of the device 400 of FIG. 4A, the electronic clock signals 206A and 206B generated by the devices 200A and 200B, respectively, and the clock signal 402 generated by the device 400.

The levels of the laser signals 202A and 202B correspond to the power of the optical radiation reaching the splitters 210A and 210B, respectively, of the circuits 200A and 200B. Each of the signals 202A and 202B exhibits respective pulses 250A and 250B between which the level of the signal is close to zero.

The laser signals 202A and 202B are at the frequency 1/t1 of the laser signal 202, and have retained the very low jitter of the initial laser signal 202 of the source 204. The optical splitter 404 and the waveguides 406A and 406B are designed so that the durations of the pulses 250A and 250B remain very short, for example less than 4 ps.

Due to the difference in length of the waveguides 406A and 406B, the pulses 250B are delayed by a duration t3 with respect to the pulses 250A. This difference in length is chosen so that the delay t3 corresponds to the pulse duration that it is desired to obtain in the clock signal 402, for example a pulse duration of between 100 and 1000 ps.

Upon each optical pulse of the laser signal 202A, the device 200A generates an electronic pulse 252A of duration t2 between instants in time u0A and u1A. Likewise, upon each optical pulse of the signal 202B, the device 200B generates an electronic pulse 252B of duration t2 between instants in time u0B and u1B. The instants in time u0A and u0B marking the starts of the pulses 252A and 252B are separated by the delay t3. The duration t2 is shorter than the delay t3, and consequently the instant in time u0B marking the start of the pulse 252B is subsequent to the instant in time u1A marking the end of the pulse 252A. Each of the clock signals 206A and 206B exhibits very low rising and falling edge jitter and very short rise and fall times.

Upon each pulse 252A of the signal 206A, the flip-flop circuit 408 sets the clock signal 402 to a high level. Upon each pulse 252B of the signal 206B, the flip-flop circuit 408 sets the clock signal 402 to a low level. The flip-flop circuit maintains the high or low level of the clock signal 402 when the signals 206A and 206B are at their low levels. The fall times of the pulses 252A and 252B are shorter than the switching time of the flip-flop circuit 408, thereby allowing the flip-flop circuit 408 to ensure that the level of the clock signal 402 is maintained during the falling edges of the pulses 252A and 252B.

Thus, upon each pulse of the laser signal 202, the device 400 generates a clock pulse 450 in the form of a slot of duration equal to the delay t3.

Because the flip-flop circuit 408 is a high-speed circuit, and because the rise times of the pulses 252A and 252B are very short, the rise and fall times of the pulses 450 are very short, for example less than 5 ps.

Additionally, because the rising edges of the pulses 252A and 252B exhibit very low jitter, and because the delay t3 of the pulses 252B is produced without generating meaningful additional jitter with respect to the initial jitter of the laser signal 202, a clock signal 402 exhibiting especially low jitter, typically of less than 10 fs, is obtained.

Figure 5A:
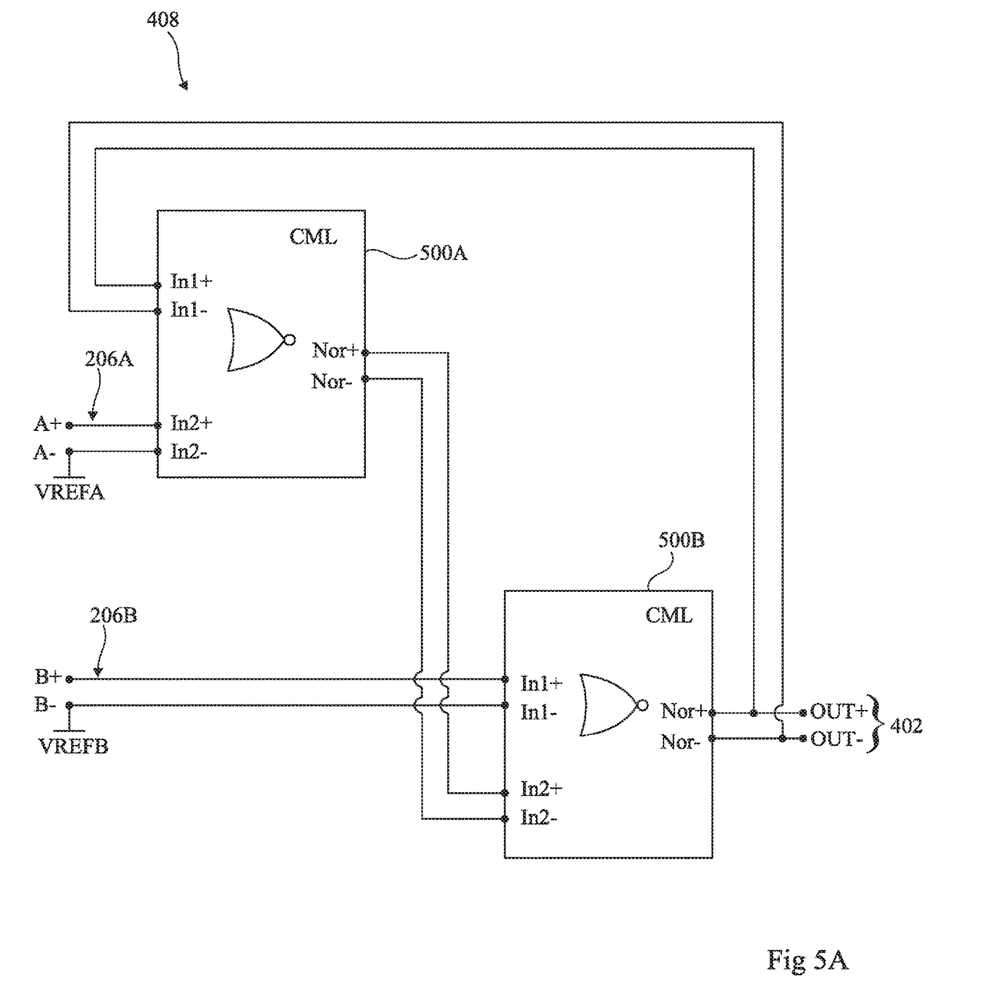
FIGS. 5A and 5B illustrate an exemplary embodiment of the flip-flop circuit of the clock device of FIG. 4A.

FIG. 5A illustrates an exemplary flip-flop circuit of the type of the flip-flop circuit 408 of the device 400 of FIG. 4A. In this example, the circuit 408 is a differential logic circuit, i.e., a circuit in which the logic level of each logic signal corresponds to a voltage between two nodes.

Thus, the signal 206A corresponds to the voltage level between input nodes A+ and A−, and the signal 206B corresponds to the voltage level between input nodes B+ and B−. By way of example, in the device 400 of FIG. 4, the nodes A+ and B+ are coupled to the nodes 218A and 218B, respectively, of the circuits 200A and 200B, and the nodes A− and B− are each connected to a node for applying a respective potential VREFA, VREFB that is between the high and low potential values of the node A+ or B+ in question, the potentials VREFA and VREFB corresponding for example to the mean value of the potentials of the respective nodes A+ and B+. Each of the nodes A+ and B+ may be connected directly to the associated node 218A or 218B, or may be coupled to this node via a capacitor for example. As a variant, any high-speed circuit capable of converting the signal 206A to a differential logic signal may be provided between, on the one hand, the node 218A and, on the other hand, the nodes A+ and A−, and any high-speed circuit capable of converting the signal 206B to a differential logic signal may be provided between, on the one hand, the node 218B and, on the other hand, the nodes B+ and B−.

Additionally, the clock signal 402 obtained here is a differential signal between two output nodes OUT+ and OUT−.

The flip-flop circuit 408 comprises two logic cells 500A and 500B, for example of CML type, generating, between nodes Nor+ and Nor−, an output signal resulting from a NOR logic operation between a first input signal between nodes In1+ and In1− and a second input signal between nodes In2+ and In2−.

In the logic cell 500A, the nodes In1+ and In1− are connected to the nodes OUT+ and OUT−, respectively, and the nodes In2+ and In2− are connected to the nodes A+ and A−, respectively.

In the logic cell 500B, the nodes In1+ and In1− are connected to the nodes B+ and B−, respectively, and the nodes In2+ and In2− are connected to the nodes Nor+ and Nor−, respectively, of the logic cell 500A. The nodes Nor+ and Nor− of the logic cell 500B are connected to the nodes OUT+ and OUT−, respectively.

Figure 5B:
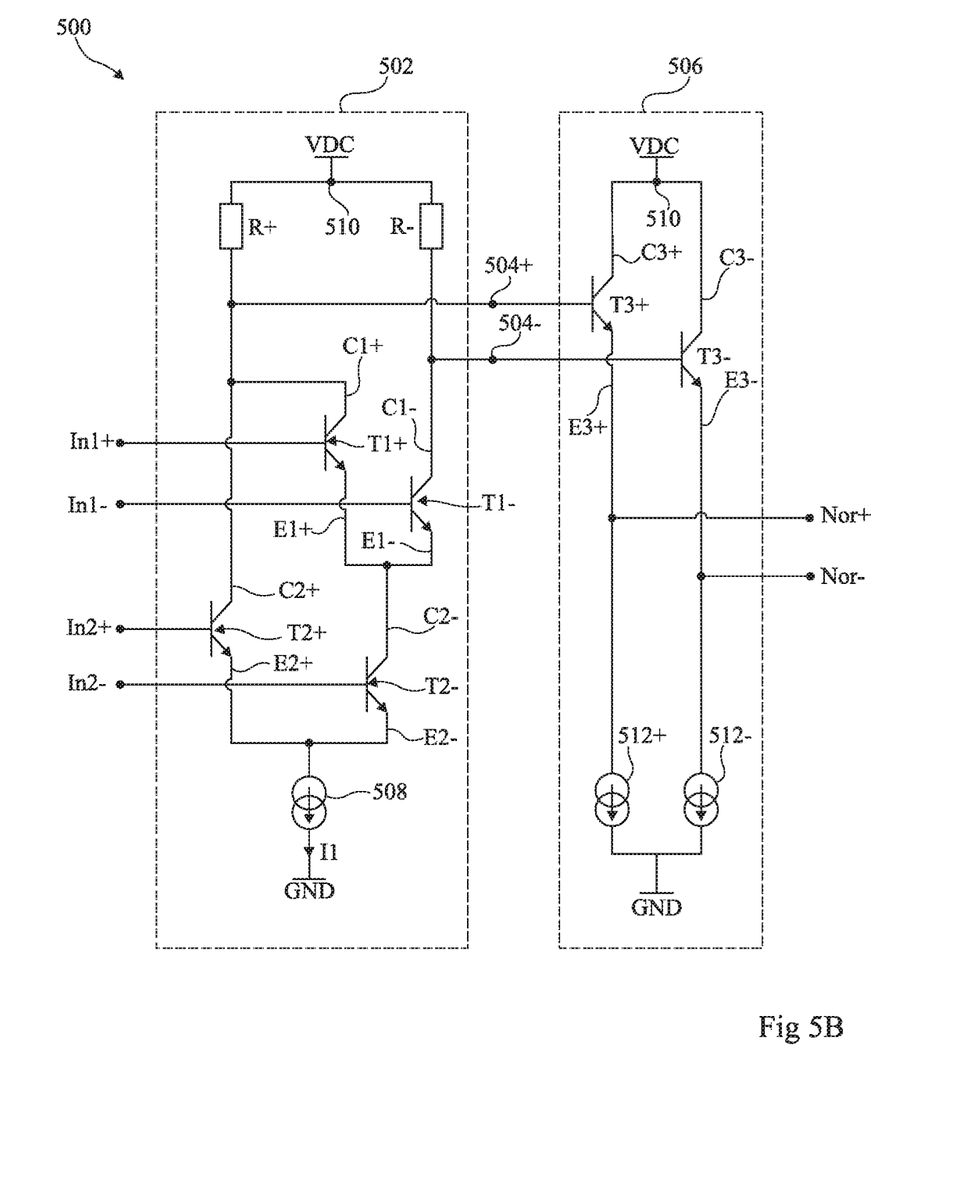

FIG. 5B illustrates an exemplary logic cell 500 of CML type, which may be used to form the logic cells 500A and 500B of the exemplary circuit 408 of FIG. 5A.

The cell 500 comprises a differential logic gate 502 that receives the input signals In1+, In1− and In2+, In2− from the cell 500 and generates a signal between the nodes 504+ and 504−. By way of example, the cell 500 additionally comprises a circuit 506 for adjusting the levels delivering the output signal Nor+, Nor− of the cell such that the potentials of the nodes Nor+ and Nor− have opposite positive and negative values. As a variant, the circuit 506 may be omitted, the nodes Nor+ and Nor− then being coupled to the nodes 504+ and 504− via capacitors.

The gate 502 comprises two bipolar transistors T2+ and T2− of NPN type, the bases of which are connected to the nodes In2+ and In2−, respectively. The emitters E2+ and E2− of the transistors T2+ and T2− are connected to one another and coupled to the ground GND via a current source 508 of a current I1. The circuit 502 additionally comprises two bipolar transistors T1+ and T1− of NPN type, the bases of which are connected to the nodes In1+ and In1−, respectively. The emitters E1+ and E1− of the transistors T1+ and T1− are connected to the collector C2− of the transistor T2−. The collector C2+ of the transistor T2+ and the collector C1+ of the transistor T1+ are together connected to the node 504+. The node 504+ is coupled to a node 510 for applying a high potential VDC via a resistor R+. The collector C1− of the transistor T1− corresponds to the node 504− and is coupled to the node 510 via a resistor R−. The resistance values of the resistors R+ and R− are substantially equal, such that the product of this value and the current I1 corresponds to a logic level of the order of 300 mV for example.

The circuit 506 comprises two bipolar transistors T3+ and T3−, the bases of which correspond to the nodes 504+ and 504−, respectively. The collectors C3+ and C3− of the transistors T3+ and T3− are connected to the node 510. Each of the emitters E3+ and E3− of the transistors T3+ and T3− is coupled to the ground GND via a current source 512+ and 512−, respectively. The emitters E3+ and E3− correspond to the output nodes Nor+ and Nor−, respectively.

One advantage of a flip-flop circuit of differential logic circuit type resides in its very short switching times between logic levels.

Particular embodiments have been described. Various variants and modifications will be apparent to those skilled in the art. In particular, although the exemplary logic cell of FIG. 5B employs bipolar transistors with coupled emitters, any type of high-speed logic cell may also be used, for example any suitable type of differential logic cell. By way of example, logic cells of the type employing MOS transistors may be used to form the logic cells 500A and 500B of the exemplary circuit 408 of FIG. 5A. By way of example, such a cell may be obtained on the basis of that of FIG. 5B by replacing the bipolar transistors of NPN type with n-channel MOS transistors. As a variant, those skilled in the art could design equivalent logic cells using bipolar transistors of PNP type or P-channel MOS transistors.

Although, in the circuit 200 of FIG. 2A, the potential of the capacitive node 218 corresponds to the level of the clock signal 206 applied to the ADC circuit 208, the node 218 may be coupled to the input of a circuit for amplifying and/or for adjusting the levels delivering the clock signal applied to the ADC circuit 208. Moreover, although, in the circuit 400 of FIG. 4A, the clock signal delivered by the flip-flop circuit 408 is applied directly to the ADC circuit 208, the output of the flip-flop circuit may be coupled to the input of a circuit for amplifying and/or for matching the levels delivering the clock signal to the ADC circuit.

Furthermore, in the embodiments described, it is possible, as a variant, to exchange the low GND and high VDC potentials and thus obtain square wave clock signals that are the inverse of the signals obtained in the embodiments described. Moreover, the obtained signal may be inverted by an inverter circuit or, in the example in which the clock signal is a differential logic signal between output nodes, by inverting the output nodes for example.

Although, in the embodiment of FIG. 4A, the devices 200A and 200B generate pulses of identical duration, the devices 200A and 200B may also generate pulses of different durations.

Although, in the embodiments described, the electronic circuit 208 receiving the clock signals is an analog-to-digital converter, the obtained clock signals may be used by any circuit employing a clock signal to operate, for example a digital or logic circuit, or it may be employed, for example, as a reference signal in a phase-locked loop (PLL).

Although one type of flip-flop circuit has been described in relation to FIGS. 5A and 5B, it is possible to use any type of asynchronous flip-flop circuit the speed of which is sufficiently high to obtain very short rise and fall times in the generated clock signals.

Additionally, in the embodiments described, an optical splitter capable of transmitting the optical pulses to waveguides of different lengths makes it possible for the same optical pulses to reach photoresistors or clock devices at instants in time that are offset by a delay. As a variant, instead of the optical splitter and the waveguides, any device allowing photoresistors or clock devices to receive, at offset instants in time, the same optical pulses arising from a pulsed laser source may be used.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for generating a clock signal, comprising:
a first photoresistor coupling a capacitive output node to a node configured to receive a first potential; and
a second photoresistor coupling the capacitive node to a node configured to receive a second potential; and
wherein the first and second photoresistors are configured to receive optical pulses at instants in time that are offset by a first delay to generate the clock signal on the capacitive node;
a first optical splitter configured to transmit the optical pulses to first and second waveguides having different lengths; wherein each photoresistor includes a germanium region on an extension of a flared portion of a silicon core of one of the first and second waveguides.

2. The device according to claim 1, wherein the first delay is substantially between 20 and 100 ps.

3. The device according to claim 1, wherein the product of a value of the capacitance of the capacitive node and a resistance value of each photoresistor in an on state is less than substantially 3 ps.

4. The device according to claim 1, wherein each photoresistor has during receipt of the optical pulses a resistance value in the on state of less than substantially 50 ohms.

5. The device according to claim 1, wherein a center wavelength of the optical pulses is substantially between 1.3 and 1.8 µm, and each photoresistor comprises a germanium region doped to less than substantially $5*10^{16}$ atoms/cm$^3$ and including two contact regions formed in the germanium region and separated by a distance of substantially between 3 and 9 µm.

6. The device according to claim 1, wherein the product of a value of the capacitance of the capacitive node and a resistance value of each photoresistor in the off state is greater than substantially 2 ns.

7. A device for generating a clock signal, comprising:
first and second clock circuits configured to receive optical pulses at instants in time that are offset by a first delay, each of the first and second clock circuits including first and second photoresistors and the photoresistors of the first and second clock circuits being coupled to first and second capacitive output nodes, respectively, and the first and second clock circuits configured generate first and second electronic signals on the first and second capacitive output nodes responsive to the received optical pulses; and a flip-flop circuit having first and second inputs coupled to the first and second capacitive nodes, respectively, and having an output, the flip-flop circuit configured to generate the clock signal on an output responsive to the first and second electronic signals, and wherein the flip-flop circuit includes a differential-type logic circuit including:

first and second current mode logic cells, each current mode logic cell including first and second differential inputs and a differential output, the first current mode logic cell including its first differential inputs coupled to receive the first electronic signal, its second differential inputs coupled to the differential outputs of the second current mode logic cell, and its differential outputs coupled to the first differential inputs of the second current mode logic cell, the second differential inputs of the second current mode logic signal coupled to receive the second electronic signal.

8. The device according to claim 7 further comprising:
a first waveguide having a first length coupled to the first clock circuit;
a second waveguide having a second length that is different than the first length coupled to the second clock circuit; and
a first optical splitter configured to receive a pulsed laser signal and to split the pulsed laser signal to thereby transmit the optical pulses through the first and second waveguides to the first and second clock circuits.

9. The device according to claim 8, where each of the first and second clock circuits further comprises:
a third waveguide having a third length coupled to the corresponding first photoresistor;
a fourth waveguide having a fourth length that is different than the third length coupled to the corresponding second photoresistor; and
a second optical splitter configured to receive the optical pulses from the corresponding first or second waveguide and to split the optical pulses to thereby transmit the optical pulses through the third and fourth waveguides to the corresponding first and second photoresistors.

10. The device according to claim 9, wherein the third and fourth lengths of the third and fourth waveguides, respectively, provide a second delay of substantially between 20 and 100 ps for the optical pulses provided to the first and second photoresistors.

11. The device according to claim 7, wherein the first delay is substantially between 100 and 1000 ps.

12. The device according to claim 7, wherein the differential-type logic circuit comprises an RS flip-flop circuit.

13. The device according to claim 7, wherein each photoresistor comprises a germanium region having contact regions formed in the germanium region, the contact regions being spaced apart by a distance that is substantially equal to between 3 and 9 μm.

14. A method of generating a clock signal, comprising:
receiving a first laser signal including a plurality of pulses, wherein a center wavelength of the optical pulses is substantially between 1.3 and 1.8 μm;
splitting the first laser signal to generate second and third laser signals;
delaying each of the second and third laser signals by different amounts to generate second and third delayed laser signals;
providing the delayed second laser signal to a first photoresistor coupled to a first capacitive node, the first photoresistor including a germanium region doped to less than substantially $5*10^{16}$ atoms/cm$^3$ and including two contact regions formed in the germanium region and separated by a distance of substantially between 3 and 9 μm;
providing the delayed third laser signal to a second photoresistor coupled to the first capacitive node, the second photoresistor including a germanium region doped to less than substantially $5*10^{16}$ atoms/cm$^3$ and including two contact regions formed in the germanium region and separated by a distance of substantially between 3 and 9 μm; and
generating a first clock signal on the first capacitive node in response to variations in the values of the first and second photoresistors caused by the second and third laser signals.

15. The method of claim 14, wherein delaying each of the second and third laser signals by different amounts comprises propagating the second and third laser signals through first and second waveguides having different lengths.

16. The method of claim 14 further comprising:
generating a pulsed laser signal;
splitting the pulsed laser signal to provide a first pulsed laser signal and a second pulsed laser signal;
delaying the first pulsed laser signal by a first delay to provide the first laser signal;
delaying the second pulsed laser signal by a second delay to provide a fourth laser signal, the second delay being different than the first delay;
splitting the fourth laser signal to generate fifth and sixth laser signals;
delaying each of the fifth and sixth laser signals by different amounts to generate fifth and sixth delayed laser signals;
providing the delayed fifth laser signal to a third photoresistor coupled to a second capacitive node;
providing the delayed sixth laser signal to a fourth photoresistor coupled to the second capacitive node;
generating a second clock signal on the second capacitive node in response to variations in the values of the third and fourth photoresistors caused by the provided delayed fifth and sixth laser signals; and
generating an output clock signal responsive to the first and second clock signals.

\* \* \* \* \*

UNITED STATES PATENT AND TRADEMARK OFFICE
CERTIFICATE OF CORRECTION

PATENT NO. : 10,312,889 B2
APPLICATION NO. : 15/605541
DATED : June 4, 2019
INVENTOR(S) : Denis Pache et al.

Page 1 of 1

It is certified that error appears in the above-identified patent and that said Letters Patent is hereby corrected as shown below:

On the Title Page

Item (56):
""Enhanced Responsivity up to 2.85 A/W of Si-based $Ge_{0.9}Sn_{0.1}$ Photoconductors by Integration of interdigitated Electrodes," 2015 Conference on Lasers and Electro-Optics (CLEO), May 10-15, 2015, San Jose, CA, 2 pages." should read, --Pham et al., "Enhanced Responsivity up to 2.85 A/W of Si-based $Ge_{0.9}Sn_{0.1}$ Photoconductors by Integration of interdigitated Electrodes," 2015 Conference on Lasers and Electro-Optics (CLEO), May 10-15, 2015, San Jose, CA, 2 pages."--.

In the Claims

Column 12, Line 6 Claim 14:
"wherein a center wavelength of the optical pulses is" should read, --wherein a center wavelength of the plurality of pulses is--.

Signed and Sealed this
Sixteenth Day of July, 2019

Andrei Iancu
*Director of the United States Patent and Trademark Office*